(12) United States Patent
Takai

(10) Patent No.: US 10,833,055 B2
(45) Date of Patent: Nov. 10, 2020

(54) SEMICONDUCTOR DEVICE AND OPTICAL COUPLING DEVICE

(71) Applicant: KABUSHIKI KAISHA TOSHIBA, Tokyo (JP)

(72) Inventor: Naoya Takai, Yukuhashi Fukuoka (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 114 days.

(21) Appl. No.: 16/132,702

(22) Filed: Sep. 17, 2018

(65) Prior Publication Data

US 2019/0019784 A1  Jan. 17, 2019

Related U.S. Application Data

(62) Division of application No. 15/047,870, filed on Feb. 19, 2016, now Pat. No. 10,115,714.

(30) Foreign Application Priority Data

Sep. 4, 2015  (JP) .................................. 2015-175055

(51) Int. Cl.
*H01L 25/16* (2006.01)
*H01L 23/498* (2006.01)
(Continued)

(52) U.S. Cl.
CPC .......... *H01L 25/167* (2013.01); *H01L 23/373* (2013.01); *H01L 23/49811* (2013.01);
(Continued)

(58) Field of Classification Search
CPC ............ H01L 23/3135; H01L 25/0657; H01L 25/074; H01L 25/0756; H01L 25/167; H01L 31/12–173; H01L 33/52–56
See application file for complete search history.

(56) References Cited

U.S. PATENT DOCUMENTS 4,122,479 A    10/1978  Sugawara et al.
H0073    H  *  6/1986  Claasen ................ H01L 23/293
                                                          257/669
(Continued)

FOREIGN PATENT DOCUMENTS

JP    S5869965 U    5/1983
JP    H07307469 A   11/1995
(Continued)

OTHER PUBLICATIONS

Taiwan Office Action dated Aug. 25, 2016, filed in Taiwan counterpart Application No. 105106019, 6 pages (with translation).
(Continued)

*Primary Examiner* — Bryan R Junge
(74) *Attorney, Agent, or Firm* — Kim & Stewart LLP

(57) ABSTRACT

According to one embodiment, a semiconductor device includes a first semiconductor element having a first surface, a second semiconductor element having a lower surface bonded to the first surface of the first semiconductor element, a gel-like silicone that covers an upper surface of the second semiconductor element, and a resin portion that covers the gel-like silicone and the first surface of the first semiconductor element.

9 Claims, 4 Drawing Sheets

(51) Int. Cl.
*H01L 23/00* (2006.01)
*H01L 23/373* (2006.01)
*H01L 31/16* (2006.01)
*H01L 31/00* (2006.01)

(52) U.S. Cl.
CPC ........ *H01L 23/49827* (2013.01); *H01L 24/32* (2013.01); *H01L 31/00* (2013.01); *H01L 31/16* (2013.01); *H01L 2224/32501* (2013.01); *H01L 2224/32505* (2013.01); *H01L 2924/06* (2013.01)

(56) References Cited

U.S. PATENT DOCUMENTS

| | | |
|---|---|---|
| 4,857,746 A | 8/1989 | Kuhlmann et al. |
| 5,608,237 A | 3/1997 | Aizawa et al. |
| 6,445,008 B1 | 9/2002 | Lin et al. |
| 6,747,293 B2 | 6/2004 | Nitta et al. |
| 6,806,509 B2 | 10/2004 | Yoshino et al. |
| 6,943,378 B2 | 9/2005 | Kek et al. |
| 2002/0190262 A1* | 12/2002 | Nitta .................. H01L 25/0753 257/99 |
| 2005/0035356 A1 | 2/2005 | Kek et al. |
| 2007/0029569 A1 | 2/2007 | Andrews |
| 2008/0023711 A1 | 1/2008 | Tarsa et al. |
| 2012/0286405 A1* | 11/2012 | Toyota ............... H01L 23/3107 257/666 |
| 2013/0181232 A1* | 7/2013 | Jeromerajan ....... H01L 31/0203 257/81 |
| 2014/0027807 A1 | 1/2014 | Tasaki et al. |
| 2014/0084305 A1 | 3/2014 | Fujimoto et al. |
| 2014/0284629 A1 | 9/2014 | Takai et al. |
| 2014/0374776 A1 | 12/2014 | Nakasuji et al. |
| 2016/0245996 A1* | 8/2016 | Nomura ................ H01L 25/167 |

FOREIGN PATENT DOCUMENTS

| | | |
|---|---|---|
| JP | 2002314143 A | 10/2002 |
| JP | 2003192875 A | 7/2003 |
| JP | 2004144705 A | 5/2004 |
| JP | 2006064513 A | 3/2006 |
| JP | 2006093738 A | 4/2006 |
| JP | 2006202936 A | 8/2006 |
| JP | 2009289920 A | 12/2009 |
| JP | 2010174250 A | 8/2010 |
| JP | 2011153187 A | 8/2011 |
| JP | 2012169511 A | 9/2012 |
| JP | 2012238796 A | 12/2012 |
| JP | 2015029037 A | 2/2015 |
| JP | 2015056531 A | 3/2015 |

OTHER PUBLICATIONS

Japanese Office Action dated May 10, 2018, filed in Japanese counterpart Application No. 2015-175055, 15 pages (with translation).

* cited by examiner

SEMICONDUCTOR DEVICE AND OPTICAL COUPLING DEVICE

CROSS-REFERENCE TO RELATED APPLICATIONS

This application is a division of U.S. patent application Ser. No. 15/047,870, filed on Feb. 19, 2016, which claims the benefit of priority from Japanese Patent Application No. 2015-175055, filed Sep. 4, 2015, the entire contents of each of which are incorporated herein by reference.

FIELD

Embodiments described herein relate generally to a semiconductor device and an optical coupling device.

BACKGROUND

There are optical coupling devices in which a light emitting chip is provided on a light receiving chip. In such an optical coupling device, the surface of the light emitting chip is typically covered with a first resin for protection of the light emitting chip. In addition, the surface of the resin is covered with a second resin.

However, since the first resin and the second resin generally have different thermal expansion coefficients, a strong adhesion between the first resin and the second resin leads to a concern that the light emitting chip will peeled from the light receiving chip due to force applied from the second resin portion.

DETAILED DESCRIPTION

In general, according to one embodiment, a semiconductor device includes a first semiconductor element having a first surface, a second semiconductor element having a lower surface bonded to the first surface of the first semiconductor element, a gel-like silicone that covers an upper surface of the second semiconductor element, and a resin portion that covers the gel-like silicone and the first semiconductor element.

Hereinafter, embodiments will be described with reference to the accompanying drawings.

First Embodiment

Figure 1A:
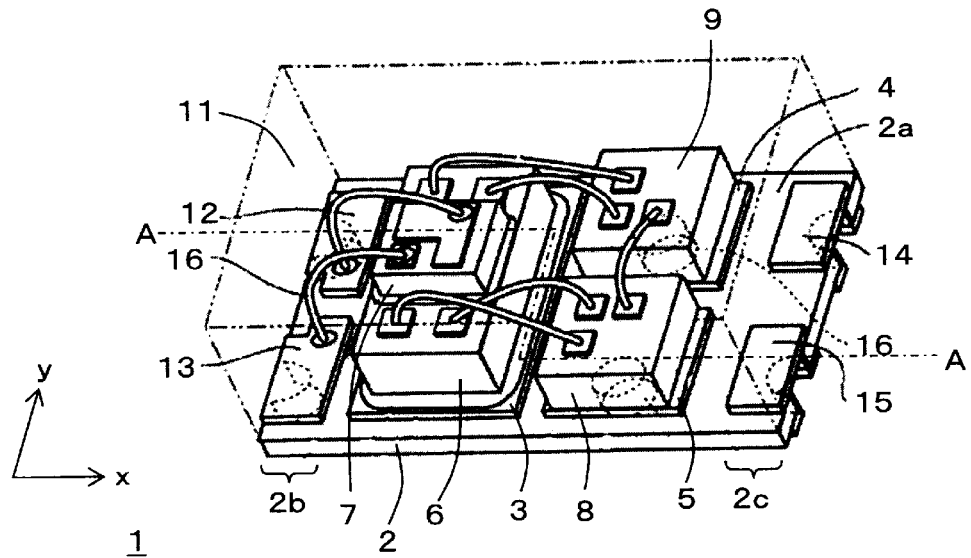
FIG. 1A is a perspective view of an optical coupling device according to an embodiment.
Figure 1B:
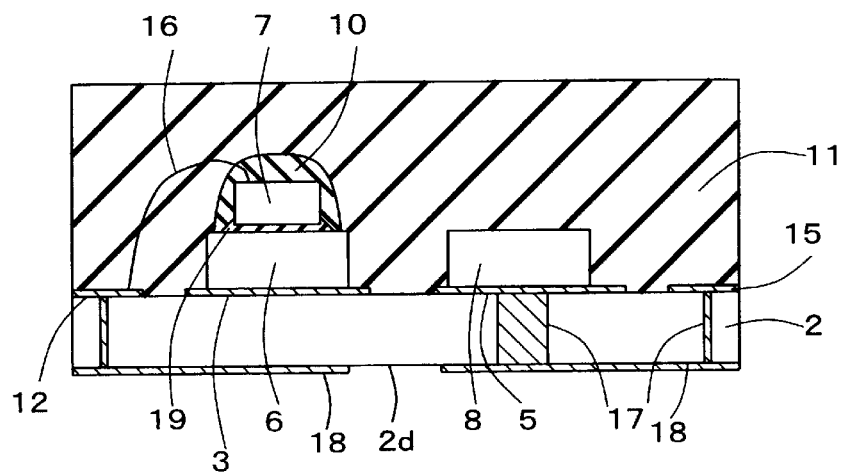
FIG. 1B is a cross-sectional view taken along line A-A of FIG. 1A.

FIG. 1A is a perspective view of an optical coupling device according to the first embodiment, and FIG. 1B is a cross-sectional view taken along line A-A of FIG. 1A. Here, the optical coupling device 1 includes a first pad 3, a second pad 4, and a third pad 5 which are arranged on a substrate 2 so as to be separated from each other, a light receiving chip 6 provided on the first pad 3, a light emitting chip 7 provided on the light receiving chip 6, a first metal oxide semiconductor field effect transistor (MOSFET) 8 provided on the second pad 4, a second MOSFET 9 provided on the third pad 5, a gel-like silicone 10 that covers the surface of the light emitting chip 7, and a resin portion 11 that covers the surface of the gel-like silicone 10. The first MOSFET 8 and the second MOSFET 9 are, for example, power semiconductor elements such as an IGBT.

In the optical coupling device 1, the light emitting chip 7 converts an input signal into an optical signal, the light receiving chip receives the optical signal in an electrically insulated state (the light emitting chip and light receiving chip are electrically isolated from each other) and converts the received optical signal into an electrical signal, and the first MOSFET 8 and the second MOSFET 9 drive a load (not specifically depicted) based on the electrical signal.

In the optical coupling device 1 illustrated in FIGS. 1A and 1B, the first MOSFET 8 and the second MOSFET 9 are integrated components, but the first MOSFET 8 and the second MOSFET 9 may be achieved using a semiconductor element separated from the optical coupling device 1.

The substrate 2 includes a first region 2b on one end side of a surface 2a in a first direction (depicted as the x direction), and a second region 2c on the other end side. That is, first region 2b is on one end of the substrate 2 and the second region 2c is on another end of the substrate 2. FIG. 1A depicts the first region 2b on the left-page side of substrate 2 and the second region 2c on the right-page side of substrate 2. In addition, a pattern 18 is provided on a rear surface 2d of substrate 2. A first terminal 12 and a second terminal 13 are in the first region 2b, and a third terminal 14 and a fourth terminal 15 are in the second region 2c. The first terminal 12 is connected to an anode of the light emitting chip 7 through a bonding wire 16, and the second terminal 13 is connected to a cathode of the light emitting chip 7 through another bonding wire 16. The third terminal 14 is a power terminal, and the fourth terminal 15 is a ground terminal. The third terminal 14 and the fourth terminal 15 are electrically connected to the pattern 18 through separate contacts 17—that is, one contact 17 connects third terminal 14 to the pattern 18 and a different contact 17 connects fourth terminal 15 to the pattern 18. The patterns 18 are also electrically connected to the second pad 4 and the third pad 5 through separate contacts 17. In addition, bonding wires 16 for connection the light receiving chip 6 to each of the first and second MOSFETs 8 and 9 and a bonding wire 16 for connecting the first and second MOSFETs 8 and 9 are provided.

The light emitting chip 7 may be a semiconductor device with a single light-emitting element (such as a light emitting diode (LED)) or may be a single semiconductor element package accommodating a substrate on which one or more light-emitting elements is mounted and a substrate on which a peripheral circuit for operating the light-emitting element (s) is mounted. The light receiving chip 6 is a semiconductor element including a light-receiving element, such as a photodiode.

A light emitting surface of the light emitting chip 7 is arranged to face a light receiving surface on the upper surface side of the light receiving chip 6. The light emitting chip 7 and the light receiving chip 6 are bonded to each other using, for example, a transparent adhesive member 19 obtained by hardening a paste-like, transparent silicone. The term "transparent" as used herein refers to being transmissive with respect to an emission wavelength of light emitted by the light emitting chip 7. The light emitting chip 7 is stacked on the light receiving chip 6, and the light emitting surface of the light emitting chip 7 and the light receiving surface of the light receiving chip 6 are arranged facing each other across a short distance. Thereby, light from the light emitting chip 7 can be received by the light receiving chip 6 without substantial loss, and thus optical coupling characteristics providing light receiving efficiency are improved.

As illustrated in FIG. 1B, gel-like silicone 10 covers the surface of the light emitting chip 7 and a portion of the bonding wire 16 connected to the upper surface of the light emitting chip 7. As described later, the gel-like silicone 10 has a property of being lower in hardness than a rubber-like silicone—that is, softer in comparison.

The gel-like silicone 10 is able to be flexibly change shape in accordance with stresses or strains resulting from variations in environmental conditions such as temperature and humidity. Accordingly, the gel-like silicone 10 functions as a tension relaxing member. The gel-like silicone 10 may be either transparent or opaque to the emission wavelength.

As illustrated in FIG. 1B, the resin portion 11 covers the surface of the gel-like silicone 10 and the surface of the light receiving chip 6, and covers the surfaces of the first MOSFET 8 and the second MOSFET 9. The resin portion 11 serves to encapsulate the light receiving chip 6 and the light emitting chip 7 and covers the outer surface of the gel-like silicone 10. The resin portion 11 is formed of an epoxy resin mixed with, for example, particulate carbon or titanium dioxide ($TiO_2$). The resin portion 11 has a light shielding property such that light from the outside of the optical coupling device 1 does not enter the silicone 10. That is, the resin portion 11 is formed of a material not being light transmissive with respect to light emitted from the light emitting chip 7.

In the related art, the surface of the light emitting chip 7 is covered with rubber-like silicone. In order to increase adhesiveness between this rubber-like silicone and resin similar to resin portion 11 (e.g., an epoxy resin), it is typically preferable that plasma cleaning be performed on the surface of the rubber-like silicone prior to covering with the resin similar to resin portion 11. In the plasma cleaning, the surface to be cleaned is exposed to electrons and ions having high energy, and typically a portion of the chemical bonds on the outermost surface of the object to be cleaned will be broken, thereby allowing the adhesiveness of the surface to be improved.

Figure 2:
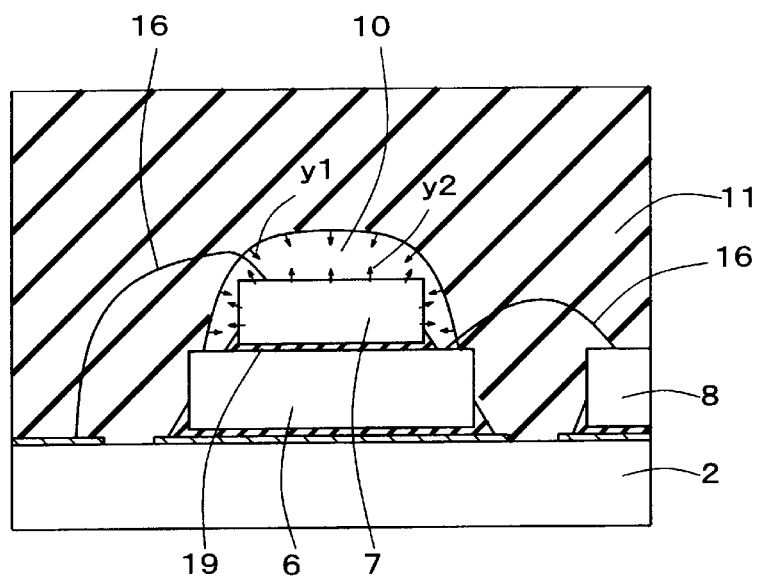
FIG. 2 is an enlarged cross-sectional view of a main portion with a direction of tension indicated by arrows. The surface of a first resin portion is covered with a second resin portion.

However, when the resin portion 11 is attached to the surface of the rubber-like silicone after plasma cleaning, adhesiveness between this silicone and the resin portion 11 is greatly increased, and thus there is a concern that the light emitting chip 7 might, as a result of the excessive adhesiveness between the rubber-like silicone and the resin portion 11, be peeled (loss of adhesion between light emitting chip 7 and the directly contacting rubber-like silicone or adhesion between light emitting chip 7 and transparent resin 19). FIG. 2 is a diagram illustrating a direction of tension which is indicated by arrows y1 and y2 when the light emitting chip 7 is stacked on the light receiving chip 6, the surface of the light emitting chip 7 is covered with the rubber-like silicone 10, the surface of the silicone 10 is subjected to plasma cleaning, and the surface of the silicone 10 is covered with the resin portion 11.

When the silicone 10 is rubber-like rather than gel-like and is covered with the resin portion 11 that is formed of an epoxy resin, the (rubber-like) silicone 10 has a thermal expansion coefficient higher than that of the epoxy resin, and thus the silicone 10 expands more than the resin portion 11 at the time of molding the resin portion 11 at elevated temperatures. As a result, the silicone 10 is pressed against the resin portion 11, and thus the silicone 10 and the resin portion 11 are firmly bonded to each other, thereby improving adhesiveness. Thereafter, when temperature falls, there is a tendency for the silicone 10 to contract in a direction of the arrow y1 of FIG. 2. However, when adhesiveness between the silicone 10 and the resin portion 11 is high, an interface between the silicone 10 and the resin portion 11 is not moved, and thus a tension force drawing the light emitting chip 7 in a direction of the arrow y2 is applied. As a result, the transparent adhesive member 19 including the light emitting chip 7 bonded to the light receiving chip 6 may be peeled. When the light emitting chip 7 is peeled, a positional relationship between the light emitting surface and the light receiving surface is deviated, and thus a greater portion of emitted light is not successfully received by the light receiving chip 6, which results in a deterioration in optical coupling characteristics.

In this manner, when plasma cleaning is performed in order to improve adhesiveness between the silicone 10 and the resin portion 11 when using a rubber-like silicone, the light emitting chip 7 is more easily peeled.

On the other hand, when the resin portion 11 is attached onto the surface of the rubber-like silicone 10 without first performing plasma cleaning, the rubber-like silicone 10 has a contraction rate higher than that of the resin portion 11 formed of an epoxy resin, and thus peeling tends to occur at the interface between the rubber-like silicone 10 and the resin portion 11. When the silicone 10 is peeled off from the resin portion 11, the bonding wire 16 on the upper surface of the light emitting chip 7 may more easily be disconnected or damaged.

In the present embodiment, a gel-like silicone is adopted rather than adopting a rubber-like silicone for the silicone 10 element. The gel-like silicone is a material which is more easily plastically deformed as it has a lower hardness value than an epoxy resin or a rubber-like silicone. The value of hardness of the gel-like silicone can be measured by, for example, a durometer. Regarding the gel-like silicone used in the present embodiment, the value of hardness (hardness value) measured by a durometer according to JIS K 6253 or JIS K 7215 (type A) (Japanese Industrial Standards) is within a range of from 10 to 24. An experiment was conducted in which the hardness value of the silicone 10 element was varied. The experiment indicates there is a tendency for a gel-like silicone to be deformed when the hardness value is less than 10, and thus it can be understood that there is a concern that the external shape of such a soft silicone material may be unable to be stably maintained once the material is applied. A silicone having a more stable shape can be provided when the hardness value is equal to or greater than 16. In addition, when the hardness value is greater than 24, the silicone may be considered to be excessively hardened, which results in a degradation of the adhesiveness of the silicone with respect to the resin portion 11, and thus there is a concern of an interfacial gap being generated.

For reference, resin portion 11 formed of an epoxy resin has a hardness value of 75 as measured by a durometer. When the hardness value of the gel-like silicone material is within a range of from 10 to 24, adhesiveness between the silicone 10 and the resin portion 11 is acceptable. Thus, peeling or the like at the surface of the silicone 10 did not occur before and after an accelerated life test such as a pressure cooker test (PCT). It is preferable that the hardness value of the resin portion 11 is three or more times the hardness value of the silicone 10, that is, the hardness value of the resin portion 11 is preferably equal to or greater than at least 30.

According to the experiments, when the light emitting chip 7 is covered with a gel-like silicone having a hardness value of to 24, peeling of the light emitting chip 7 does not significantly occur even when an accelerated life test such as a pressure cooker test (PCT) is performed in a high-temperature, high-humidity atmosphere. In some embodiments, the hardness value of the gel-like silicone is preferably in the range of 16 to 24.

In the gel-like silicone 10, there is a tendency for a contact interface between the silicone 10 and the resin portion 11 to be flexibly moved depending on tension. Accordingly, even when tension is applied to a portion of the silicone 10, the silicone 10 functions as a tension relaxing member by releasing tension in the vicinity thereof by flexing. In addition, when the gel-like silicone 10 is used, adhesiveness with respect to the resin portion 11 is increased compared to a case where the rubber-like silicone 10 is used, and thus it is not necessary to perform plasma cleaning on the surface of the gel-like silicone 10. Thereby, it is possible to simplify a manufacturing process by omission of the plasma cleaning processing.

However, plasma cleaning may still be performed on the gel-like silicone 10 is desired. The flexibility of the interface between the silicone 10 and the resin portion 11 is not significantly damaged by the plasma cleaning, and the gel-like silicone 10 can continue to function as a tension relaxing member.

In addition, plasma cleaning may be performed before the gel-like silicone 10 is formed. That is, plasma cleaning is performed on the surfaces of the light emitting chip 7 and the light receiving chip 6 before forming the gel-like silicone 10, and thus the wettability of these surfaces can be improved, and the gel-like silicone 10 more easily attached to these surfaces.

Figure 3A:
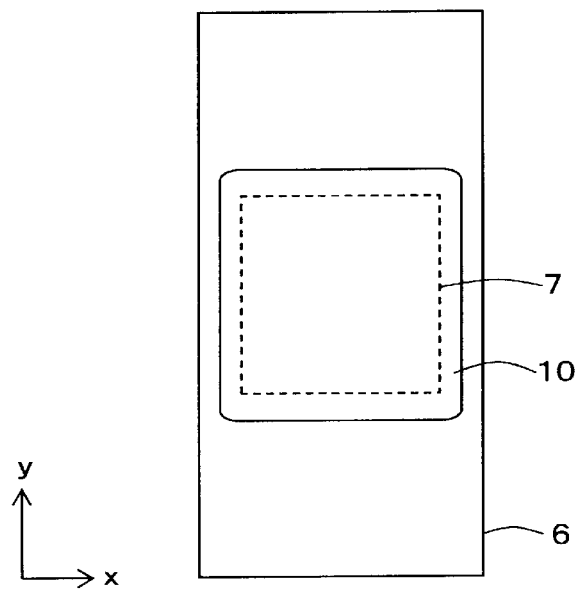
FIG. 3A is a schematic diagram illustrating the arrangement of the first resin portion when the external shape of a light receiving chip is a rectangular shape.

As the thickness of the gel-like silicone 10 becomes larger, it becomes, in general, easier to relax tension, and thus, all other things being equal, it is preferable that the silicone 10 be as thick as possible. As illustrated in FIG. 1, for example, when the external shape of the light receiving chip 6 is a rectangular shape and the external shape of the light emitting chip 7 stacked thereon is a square shape, it is preferable to arrange the light emitting chip 7 at the substantially center portion of the upper surface of the light receiving chip 6 and to arrange the silicone 10 on substantially entire upper surface of the light receiving chip 6, as illustrated in a schematic diagram of FIG. 3A. In this case, the silicone 10 is formed to be thicker in the second direction y on the side of a long side of the light receiving chip 6, and thus it is possible to further prevent the light emitting chip 7 from being peeled along this direction.

Figure 3B:
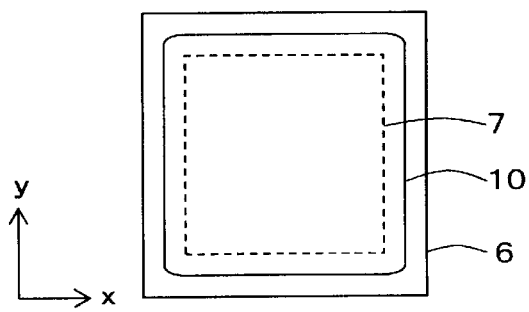
FIG. 3B is a schematic diagram illustrating the arrangement of the first resin portion when the external shape of a light receiving chip is a square shape.

Meanwhile, the external shape of the light receiving chip 6 is not necessarily limited to being a rectangular shape, and may be, for example, a square shape. In this case, as illustrated in a schematic diagram of FIG. 3B, it is preferable to arrange the light emitting chip 7 at the substantially center portion of the upper surface of the light receiving chip 6 and to equally arrange the silicone 10 in four directions.

In this manner, in the first embodiment, the light emitting chip 7 is stacked on the light receiving chip 6, the surface of the light emitting chip 7 is covered with the gel-like silicone 10, and the surface of the gel-like silicone 10 is covered with resin portion 11 formed of an epoxy resin. For this reason, a contact interface between the gel-like silicone 10 and the resin portion 11 is flexible, and the gel-like silicone 10 functions as a tension relaxing member. It is thus possible to prevent the light emitting chip 7 from being peeled even when environmental conditions such as temperature and humidity vary during operation of the light emitting device.

Second Embodiment

According to a second embodiment a light emitting chip 7 is prevented from being peeled while using a rubber-like silicone 10. Rubber-like silicone material has a hardness value greater than gel-like silicone material, for example, rubber-like silicone material has a hardness value greater than or equal to 25 as measured by a durometer in accordance with at least one of JIS K 6253 and JIS K 7215 (type A).

Figure 4:
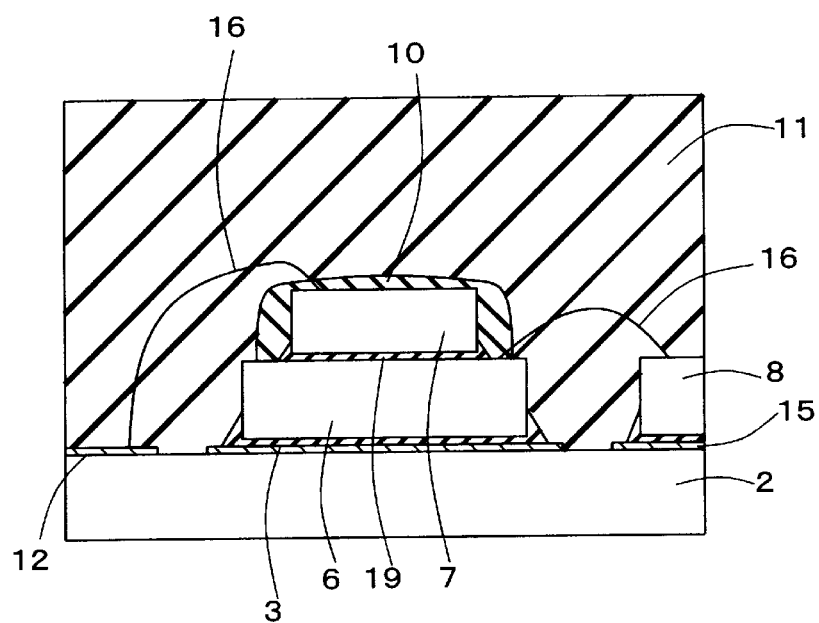
FIG. 4 is a schematic cross-sectional view illustrating a vicinity of the light emitting chip and the light receiving chip.
Figure 5:
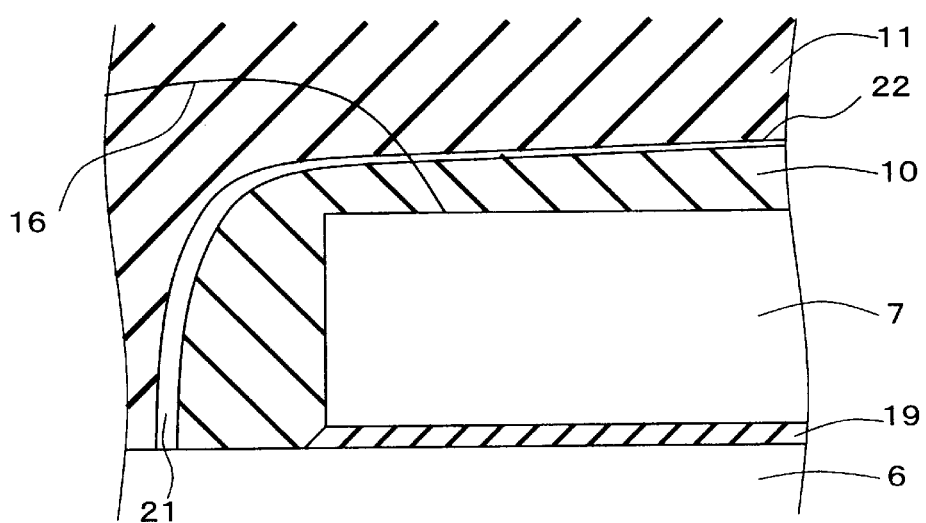
FIG. 5 is a schematic enlarged cross-sectional view illustrating an interface between rubber-like silicone and a resin portion.

An optical coupling device 1 according to the second embodiment is configured in a similar manner as that of FIG. 1. FIG. 4 is a schematic cross-sectional view illustrating the vicinity of a light emitting chip 7 and a light receiving chip 6. As illustrated in FIG. 4, the surface of the light emitting chip 7 stacked on the light receiving chip 6 and portions of bonding wires 16 connected to the light emitting chip 7 and the light receiving chip 6 are covered with the rubber-like silicone 10. The rubber-like silicone 10 is covered with a resin portion 11 that is formed of an epoxy resin or the like. FIG. 5 is a schematic enlarged cross-sectional view illustrating the vicinity of an interface between the rubber-like silicone 10 and the resin portion 11.

The rubber-like silicone 10 according to the second embodiment has different thicknesses on the upper surface side and the side surface side of the light emitting chip 7. More specifically, the thickness of the rubber-like silicone 10 on the upper surface side of the light emitting chip 7 is smaller than the thickness on the side surface side. The rubber-like silicone 10 can be attached onto the surface of the light emitting chip 7 in a high temperature state, which increases flexibility of the rubber-like silicone 10, and thus it is possible to attach a larger amount of silicone material to the side surface side of the light emitting chip 7 than to the upper surface side of the light emitting chip 7.

In the second embodiment, after the surface of the light emitting chip 7 has been covered with the rubber-like silicone 10, the resin portion 11 is formed thereon without performing plasma cleaning on the surface of the rubber-like silicone 10. The resin portion 11 is formed of, for example, an epoxy resin. When the resin portion 11 is formed without performing plasma cleaning on the surface of the rubber-like silicone 10, the rubber-like silicone 10 will expand more than the resin portion 11 due to the high temperatures during molding. For this reason, adhesiveness between the rubber-like silicone 10 and the resin portion 11 is somewhat improved. When the temperature is lowered upon the termination of the molding process used in forming the resin portion 11, the rubber-like silicone 10 contracts by a greater amount than the resin portion 11. Since the rubber-like silicone 10 is formed to be thicker on the upper surface side of the light emitting chip 7 than that on the side surface side of the light emitting chip 7, the degree of contraction is asymmetrical in that the total amount of contraction of the silicone material on the side surface side will be greater than the total amount of contraction on the silicone material on the upper surface side. The overall amount of contraction is increased because the thickness of the silicone 10 on the side surface side is larger than that on the upper surface side.

Accordingly, on the side surface side of the light emitting chip 7, a larger first gap portion 21 is formed between the rubber-like silicone 10 and the resin portion 11, as illustrated in FIG. 5. The first gap portion 21 is larger than a second gap portion 22 between the rubber-like silicone 10 and the resin portion 11 on the upper surface side of the light emitting chip 7. The second gap portion 22 is formed between the rubber-like silicone 10 and the resin portion 11, and thus the tension of the rubber-like silicone 10 pulling the light emitting chip 7 is relaxed, thereby preventing the light emitting chip 7 from being peeled.

Since the thickness of the rubber-like silicone 10 is small on the upper surface side of the light emitting chip 7, the amount of contraction of the silicone 10 is small, and a large gap is not formed between the silicone 10 and the resin portion 11. Accordingly, it is possible to prevent the bonding wire 16 which is arranged to contact the upper surface side of the light emitting chip 7 from being disconnected.

Additionally, plasma cleaning may be performed on a portion of the rubber-like silicone 10, specifically, only on the upper surface side of the light emitting chip 7 might be plasma cleaned before the surface of the rubber-like silicone 10 is covered with the resin portion 11, and adhesiveness between the silicone 10 and the resin portion 11 on the upper surface side of the light emitting chip 7 may be thereby improved. Thus, even when the rubber-like silicone 10 contracts, the second gap portion 22 is less likely to be generated between the rubber-like silicone 10 and the resin portion 11. When the rubber-like silicone 10 and the resin portion 11 are provided in contact with each other, tension of the contracting rubber-like silicone 10 acts in a direction in which the light emitting chip 7 is pulled from the light receiving chip 6. However, the thickness of the rubber-like silicone 10 is small on the upper surface side of the light emitting chip 7, and thus the resulting peeling force (tension) produced by the rubber-like silicone 10 is small. Accordingly, there is an insignificant tendency for the light emitting chip 7 to be peeled. In addition, when the rubber-like silicone 10 and the resin portion 11 are provided in contact with each other on the upper surface side of the rubber-like silicone 10, it is easier to prevent the bonding wire 16 from being disconnected.

In this manner, in the second embodiment, the thickness of the rubber-like silicone 10 on the side surface side of the light emitting chip 7 is larger than that on the upper surface side of the light emitting chip 7, and thus a gap between the rubber-like silicone 10 and the resin portion 11 on the side surface side is larger than that on the upper surface side. Accordingly, it is possible to reduce peeling force on the light emitting chip 7 and to prevent the light emitting chip 7 from being peeled. In the second embodiment, the light emitting chip 7 can be prevented from being peeled while using the rubber-like silicone 10, and thus it is possible to prevent the light emitting chip 7 from being peeled without changing the material of the silicone.

In the first and second embodiments described above, a description has been given of a structure for preventing peeling from occurring when the light-emitting element 7 is bonded onto the light receiving chip 6, but the light receiving chip 6 and the light-emitting element 7 are not essential components. The exemplary embodiments can be applied to various semiconductor devices in which a second semiconductor element is bonded onto a first semiconductor element, and the specific of the first semiconductor element and the second semiconductor element do not particularly matter. That is, any two elements which are bonded together for packaging within resin materials may incorporate the disclosed embodiments so as to prevent or reduce peeling, delamination, de-bonding or the like of the two bonded elements. As used herein, "value of hardness" or "hardness value" of a material is the value measured in accordance with at least one of JIS K 6253 and JIS K 7215 (type A) (Japanese Industrial Standards) as applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor element on a surface of a substrate;
   a second semiconductor element having a lower surface bonded to an upper surface of the first semiconductor element;
   a rubber-like silicone covering an upper surface and a side surface of the second semiconductor element;
   a resin portion covering an outer surface of the rubber-like silicone and the first semiconductor element;
   a first gap between the rubber-like silicone and the resin portion on the upper surface of the second semiconductor element; and
   a second gap between the rubber-like silicone and the resin portion on the side surface of the second semiconductor element, wherein
   a thickness of the rubber-like silicone on the upper surface of the second semiconductor element is smaller than a thickness of the rubber-like silicone on the side surface of the second semiconductor element, the thicknesses being respectively measured along a direction normal to the upper surface of the second semiconductor element and the side surface of the second semiconductor element, and
   a spacing between the rubber-like silicone and the resin portion in the first gap is less than a maximum width spacing between the rubber-like silicone and the resin portion in the second gap.

2. The semiconductor device according to claim 1, wherein the outer surface of the rubber-like silicone is modified by plasma cleaning prior to application of the resin portion thereon.

3. The semiconductor device according to claim 1, wherein
   the first semiconductor element includes a light receiving portion,
   the second semiconductor element includes a light emitting portion, and
   the light emitting portion faces the light receiving portion.

4. The semiconductor device according to claim 1, wherein the rubber-like silicone and the resin portion on the upper surface of the second semiconductor element are in contact with each other.

5. The semiconductor device according to claim 1, wherein the resin portion has a durometer-measured hardness greater than a durometer measured hardness of the rubber-like silicone.

6. A semiconductor device, comprising:
   a first semiconductor element on a surface of a substrate;
   a second semiconductor element having a lower surface bonded to an upper surface of the first semiconductor element;
   a rubber-like silicone covering an upper surface and a side surface of the second semiconductor element; and
   a resin portion covering an outer surface of the rubber-like silicone and the first semiconductor element;
   a first gap between the rubber-like silicone and the resin portion on the upper surface of the second semiconductor element; and
   a second gap between the rubber-like silicone and the resin portion on the side surface of the second semiconductor element, wherein a spacing between the rubber-like silicone and the resin portion in the first gap is less than a maximum width spacing between the rubber-like silicone and the resin portion in the second gap.

7. The semiconductor device according to claim 6, wherein the outer surface of the rubber-like silicone is modified by plasma cleaning prior to application of the resin portion thereon.

8. The semiconductor device according to claim 6, wherein
   the first semiconductor element includes a light receiving portion,
   the second semiconductor element includes a light emitting portion, and
   the light emitting portion faces the light receiving portion.

9. The semiconductor device according to claim 6, wherein the resin portion has a durometer-measured hardness greater than a durometer measured hardness of the rubber-like silicone.

\* \* \* \* \*